US007936842B2

(12) United States Patent
Kimura et al.

(10) Patent No.: US 7,936,842 B2
(45) Date of Patent: May 3, 2011

(54) AUTOMATIC BIT RATE CONTROL CIRCUIT

(75) Inventors: Shunji Kimura, Chiba (JP); Tomoaki Yoshida, Chiba (JP); Koji Kitahara, Zama (JP); Hiroshi Takada, Mito (JP)

(73) Assignees: Nippon Telegraph and Telephone Corporation, Tokyo (JP); NTT Electronics Corporation, Tokyo (JP)

( * ) Notice: Subject to any disclaimer, the term of this patent is extended or adjusted under 35 U.S.C. 154(b) by 1377 days.

(21) Appl. No.: 10/543,656

(22) PCT Filed: Feb. 16, 2005

(86) PCT No.: PCT/JP2005/002341
§ 371 (c)(1),
(2), (4) Date: May 4, 2006

(87) PCT Pub. No.: WO2005/078969
PCT Pub. Date: Aug. 25, 2005

(65) Prior Publication Data
US 2006/0268969 A1    Nov. 30, 2006

(30) Foreign Application Priority Data

Feb. 16, 2004    (JP) ................................ 2004-037963

(51) Int. Cl.
*H04L 27/08* (2006.01)
(52) U.S. Cl. ........................................ 375/297; 375/345
(58) Field of Classification Search .................. 375/297, 375/345
See application file for complete search history.

(56) References Cited

U.S. PATENT DOCUMENTS

| 6,040,933 | A  | * | 3/2000 | Khaleghi et al. ................. 398/1 |
| 6,972,880 | B1 | * | 12/2005 | Kanesaka ...................... 398/160 |
| 2003/0002108 | A1 |  | 1/2003 | Ames et al. |

FOREIGN PATENT DOCUMENTS

| JP | 03-258059 | 11/1991 |
| JP | 09-233030 | 9/1997 |
| JP | 11-136142 | 5/1999 |
| JP | 2000-40960 | 2/2000 |
| JP | 3147038 | 1/2001 |
| JP | 2003-115894 | 4/2003 |

* cited by examiner

*Primary Examiner* — David B Lugo
(74) *Attorney, Agent, or Firm* — Oblon, Spivak, McClelland, Maier & Neustadt, L.L.P.

(57) ABSTRACT

A bit-rate automatic control circuit for feedback controlling the gain and bandwidth of a preamplifier in dependence on the bit-rate of a signal is disclosed. The circuit includes a bit-rate discrimination circuit configured to discriminate the bit rate of the signal, and an alarm circuit configured to determine whether the value of received power of the signal is less than the minimum acceptable value of the preamplifier or not. If said alarm circuit determines that the value of received power of the signal is less than the minimum acceptable value of the preamplifier, the bit-rate automatic control circuit determines, irrespective of the discrimination of said bit-rate discrimination circuit, that the bit-rate of the signal is low, and feedback controls the preamplifier based on the determination. According to the above arrangements, if a determination is made that the reception level of the input signal is lower than the minimum acceptable value of received power, the preamplifier can be switched from a state for receiving a high bit-rate signal to a state for receiving a low bit-rate signal.

15 Claims, 19 Drawing Sheets

FIG.6

|  | HIGH → LOW | LOW → HIGH |
|---|---|---|
| $P_{minH} \leqq P_{in}$ | LOW | HIGH |
| $P_{minL} < P_{in} \leqq P_{minH}$ | LOW | HIGH/LOW |
| $P_{in} \leqq P_{minL}$ | LOW | LOW |

FIG.7

|  | HIGH → LOW | LOW → HIGH |
|---|---|---|
| $P_{minH} \leqq P_{in}$ | LOW | HIGH |
| $P_{minL} < P_{in} \leqq P_{minH}$ | LOW | ... |
| $P_{in} \leqq P_{minL}$ | ... | ... |

FIG.8

|  | HIGH → LOW | LOW → HIGH |
|---|---|---|
| $P_{minH} \leqq P_{in}$ | LOW | ? |
| $P_{minL} < P_{in} \leqq P_{minH}$ | LOW | ? |
| $P_{in} \leqq P_{minL}$ | ? | ? |

FIG.9

|  | HIGH → LOW | LOW → HIGH |
|---|---|---|
| $P_{minH} \leqq P_{in}$ | LOW | HIGH |
| $P_{minL} < P_{in} \leqq P_{minH}$ | HIGH | HIGH |
| $P_{in} \leqq P_{minL}$ | HIGH | HIGH |

AUTOMATIC BIT RATE CONTROL CIRCUIT

TECHNICAL FIELD

The present invention generally relates to the control of a pre-amplifier in dependence on bit-rate, and particularly, to a bit-rate control circuit for controlling a pre-amplifier in a receiver in dependence on the bit-rate of a received signal and a multi bit-rate receiver including the bit-rate control circuit.

BACKGROUND ART

A receiver that can receive multiple transmission speed (bit-rate) signal and optimize its performance in dependence on the bit-rate is proposed (see Patent Document 1, for example). Such a receiver includes a bit-rate discrimination circuit that automatically discriminates the bit-rate of a received signal.

FIG. 1 shows a conventional bit-rate discrimination circuit described in the Patent Document 1. In FIG. 1, a reference numeral 10 denotes an input terminal; 11 denotes an output terminal; 12 denotes a delay circuit; 13 denotes a dual-input exclusive OR circuit; 14 denotes a mean value detector; 15 denotes a level decision circuit; and 16 denotes a reference voltage ($V_{ref}$) input terminal. FIG. 2 shows the waveforms at various points in the bit-rate discrimination circuit shown in FIG. 1. In FIG. 2, the waveform A shows the waveform of an input signal; B shows the waveform of an output signal from the exclusive OR circuit 13; C shows the waveform of an output signal from the mean value detector 14; and D shows the waveform of an output signal from the level decision circuit 15. The point at which each waveform is measured is shown in FIG. 1.

The conventional bit-rate discrimination circuit includes the delay circuit 12 and the exclusive OR circuit 13 at the input stage, which generate and output a pulse at the rise and fall edge of the input signal A. The pulse width of the output pulse is determined by the delay time of the delay circuit 12. If the bit-rate of the input signal is high, the density of the pulse is high, and if the bit-rate of the input signal is low, the density is low. By averaging the density of the pulse using the mean value detector 14, the output voltage is high for a high bit-rate input signal, and low for low bit-rate input signal. The level decision circuit 15 compares the output voltage from the mean value detector 14 with the reference voltage ($V_{ref}$), and output a control signal in dependence on the bit-rate. The conventional receiver described in the Patent Document 1 can receive signals of different bit-rates by adjusting the performance of a phase synchronization circuit using the above bit-rate discrimination circuit for feed-forward type bit-rate automatic control.

However, if used for a feed-back control type bit-rate automatic control, the conventional bit-rate discrimination circuit described above may fail to accurately discriminate the bit-rate. FIG. 3 is a block diagram showing an exemplary multi bit-rate receiver in which the above problem may occur. In FIG. 3, a reference numeral 1 denotes a photo detector; 2 denotes a power supply or an electrical ground; 3 denotes a single-end type amplifier; 4 denotes a buffer; 5 denotes a main amplifier; 6 denotes a bit-rate discrimination circuit; 7 denotes a variable feedback resistor; 8 denotes a preamplifier; and 9 denotes an output terminal.

An optical signal is converted into a current signal by the photo detector 1 such as a photo diode, and the current signal is input to the preamplifier 8. The preamplifier 8 includes a trans-impedance amplifier and a buffer 4, the trans-impedance amplifier consisting of a single-end type amplifier 3 and its feedback resistance 7. The trans-impedance amplifier can convert an input weak current signal into an amplified voltage signal. The buffer 4 is inserted for the purpose of improving the impedance matching between the trans-impedance amplifier and the main amplifier 5, and enabling single-balance conversion. The main amplifier 5 can limit the amplitude of a signal or automatically control gain thereby to amplify the output signal from the preamplifier 8 to a constant amplitude signal.

In general, receiver sensitivity is substantially determined by noise level of the preamplifier 8, and depends on the value of the variable feedback resistor 7 in the trans-impedance amplifier. If the value of the feedback resistor 7 is increased (hereinafter, referred to as low speed mode), the trans-impedance amplifier only can receive a low bit-rate signal because its band width becomes low. The trans-impedance gain is increased, and the minimum acceptable value of received power is improved because noise current is reduced. To the contrary, if the value of the variable feedback resistor 7 is low (hereinafter referred to as high speed mode), the trans-impedance amplifier can receive even a high bit-rate signal because its band width is increased. However, the trans-impedance gain is reduced, and the minimum acceptable value of received power is increased due to the increase in noise current. That is, there exists the optimal value of the variable feedback resistor 7 of the trans-impedance amplifier at which the bit-rate of the received optical signal is acceptable and at the same time the receiver sensitivity is as high as possible (the minimum acceptable value of received power is as low as possible). The multi bit-rate receiver shown in FIG. 3 uses feedback control type bit-rate automatic control that adjusts the value of the variable feedback resistor using the discrimination result of the bit-rate discrimination circuit 6 for the above optimization.

[Patent Document 1] JP2000-40960

However, the conventional multi bit-rate receiver described above may fail to accurately discriminate the bit-rate when the bit-rate is switched from low speed to high speed. In addition, even if a bit-rate discrimination circuit is used that can accurately discriminate the bit-rate even if the high frequency component of the signal is lost, the multi bit-rate receiver can not adjust itself to the change in the minimum acceptable value of received power due to the mode change of the preamplifier 8.

DISCLOSURE OF INVENTION

It is a general object of the present invention to provide a bit-rate automatic control circuit in which the above-mentioned problems are eliminated.

To achieve the above object, a bit-rate automatic control circuit for feedback controlling the gain and bandwidth of a preamplifier in dependence on the bit-rate of a signal is characterized that the circuit includes a bit-rate discrimination circuit configured to discriminate the bit rate of the signal; an alarm circuit configured to determine whether the value of received power of the signal is less than the minimum acceptable value of the preamplifier or not, wherein if said alarm circuit determines that the value of received power of the signal is less than the minimum acceptable value of the preamplifier, the bit-rate automatic control circuit determines, irrespective of the discrimination of said bit-rate discrimination circuit, that the bit-rate of the signal is low, and if said alarm circuit determines that the value of received power of the signal is equal to or more than the minimum acceptable value of the preamplifier, the bit-rate automatic control circuit determines the bit-rate of the signal in accordance with the discrimination made by said bit-rate discrimination circuit.

If the alarm circuit determines that the reception level of the input signal is lower than the minimum acceptable value of received power, the bit-rate automatic control circuit determines that the input signal is of low bit-rate regardless of the output of the bit-rate discrimination circuit, and feedback controls the preamplifier based on the determination. According to the above arrangements, if a determination is made that the reception level of the input signal is lower than the minimum acceptable value of received power, the preamplifier can be switched from a state for receiving high bit-rate to a state for receiving low bit-rate.

According to another aspect of the present invention, a multi bit-rate receiver capable of adjusting sensitivity to the bit-rate of a signal is characterized in that the receiver includes a preamplifier configured to amplify the signal; a main amplifier configured to amplify the output of said preamplifier to a constant-amplitude signal; and the bit-rate automatic control circuit as described above, for feedback controlling the gain and band width of said preamplifier in dependence on the output of said preamplifier and the output of said main amplifier.

Other objects, features and advantages of the present invention will become more apparent from the following detailed description when read in conjunction with the accompanying drawings.

BRIEF DESCRIPTION OF DRAWINGS

FIG. 6 is a diagram for explaining the discrimination result of the bit-rate automatic control circuit according to the present invention;

FIG. 7 is a diagram for explaining the ideal discrimination result of a bit-rate discrimination circuit;

FIG. 8 is a diagram for explaining the discrimination result of the conventional bit-rate discrimination circuit;

FIG. 9 is a diagram for explaining the discrimination result obtained from a bit-rate discrimination circuit capable of accurately discriminating the bit-rate of a signal even if the high frequency component of the signal is lost;

DESCRIPTION OF REFERENCE NUMERALS AND LETTERS

1 PHOTO DETECTOR
2 POWER SUPPLY OR GROUNDING
3 SINGLE END TYPE AMPLIFIER
4 BUFFER
5 MAIN AMPLIFIER
6 BIT-RATE DISCRIMINATION CIRCUIT
7 VARIABLE FEEDBACK RESISTOR
8 PREAMPLIFIER
9 OUTPUT TERMINAL
10 INPUT TERMINAL
11 OUTPUT TERMINAL
12 DELAY CIRCUIT
13 DUAL INPUT EXCLUSIVE OR CIRCUIT
14 MEAN VALUE DETECTOR
15 LEVEL DECISION CIRCUIT
16 REFERENCE VOLTAGE INPUT TERMINAL
17 FIRST STAGE INTEGRATOR
18 HYSTERESIS COMPARATOR
19 SECOND STAGE INTEGRATOR
20 COMPARATOR
21 REFERENCE VOLTAGE INPUT TERMINAL
22 BIT-RATE AUTOMATIC CONTROL CIRCUIT
23 ALARM CIRCUIT
24 CONTROL TERMINAL FOR SWITCHING FEEDBACK RESISTOR
25 DUAL INPUT OR CIRCUIT
26 MULTIPLIER
27 INTEGRATOR
28 COMPARATOR
29 INVERTED OUTPUT TERMINAL OF COMPARATOR
30 REFERENCE VOLTAGE INPUT TERMINAL OF COMPARATOR
31 DUAL INPUT NEGATIVE OR CIRCUIT
32 DUAL INPUT NEGATIVE AND CIRCUIT
33 DUAL INPUT AND CIRCUIT
34 SWITCH
35 CONSTANT VOLTAGE SOURCE CIRCUIT OR GROUNDING
36 INVERTER
37 INTEGRATOR
38 COMPARATOR
39 REFERENCE VOLTAGE INPUT TERMINAL OF COMPARATOR
40 ALARM OUTPUT TERMINAL
41 D/A CONVERTER
42 VARIABLE RESISTOR OR VARIABLE RESISTOR ELEMENT
43 FEEDBACK RESISTOR
44, 45 BRANCH OR DISTRIBUTION CIRCUIT
46 FEEDBACK RESISTOR

47 VOLTAGE CONTROL SWITCH OR SWITCH ELEMENT
48 N-INPUT D/A CONVERTER
A INPUT SIGNAL WAVEFORM
B OUTPUT WAVEFORM OF DUAL INPUT EXCLUSIVE OR CIRCUIT
C OUTPUT WAVEFORM OF INTEGRATOR
D OUTPUT WAVEFORM OF LEVEL DECISION CIRCUIT
A1 INPUT WAVEFORM OF LOW BIT-RATE
A2 INPUT WAVEFORM OF HIGH BIT-RATE
B1 OUTPUT WAVEFORM OF FIRST STAGE INTEGRATOR (LOW BIT-RATE INPUT)
B2 OUTPUT WAVEFORM OF FIRST STAGE INTEGRATOR (HIGH BIT-RATE INPUT)
C1 OUTPUT WAVEFORM OF HYSTERESIS COMPARATOR (LOW BIT-RATE INPUT)
C2 OUTPUT WAVEFORM OF HYSTERESIS COMPARATOR (HIGH BIT-RATE INPUT)
D1 OUTPUT WAVEFORM OF SECOND STAGE INTEGRATOR (LOW BIT-RATE INPUT)
D2 OUTPUT WAVEFORM OF SECOND STAGE INTEGRATOR (HIGH BIT-RATE INPUT)
E1 OUTPUT WAVEFORM OF COMPARATOR (LOW BIT-RATE INPUT)
E2 OUTPUT WAVEFORM OF COMPARATOR (HIGH BIT-RATE INPUT)

BEST MODE FOR CARRYING OUT THE INVENTION

The background of the present invention is described in further detail before explaining the preferred embodiments of the present invention.

Figure 1:
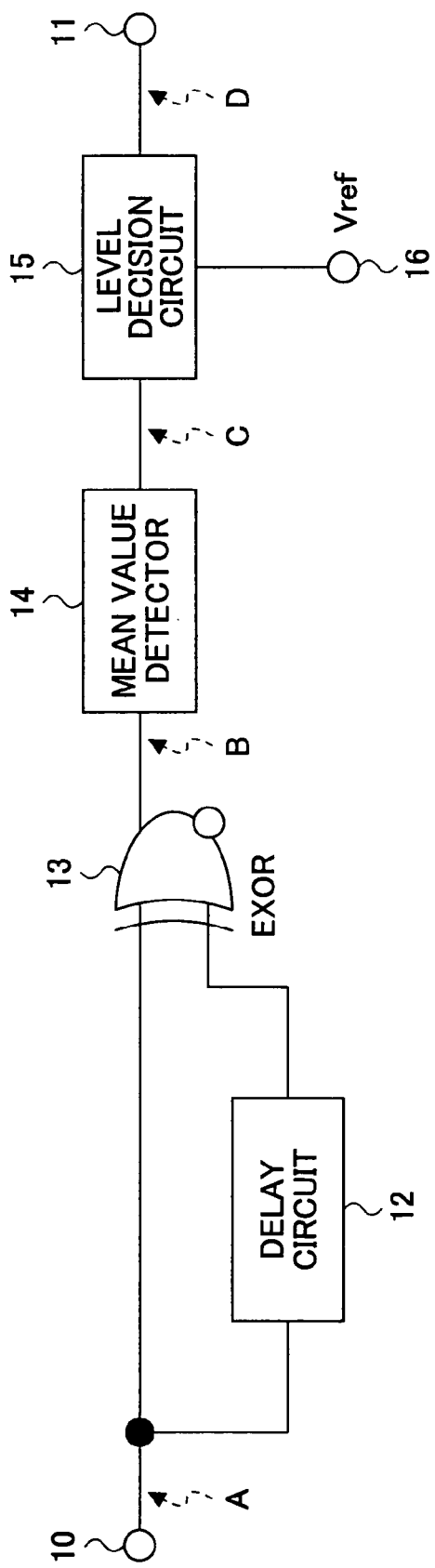
FIG. 1 is a block diagram showing a conventional bit-rate discrimination circuit.
Figure 2:
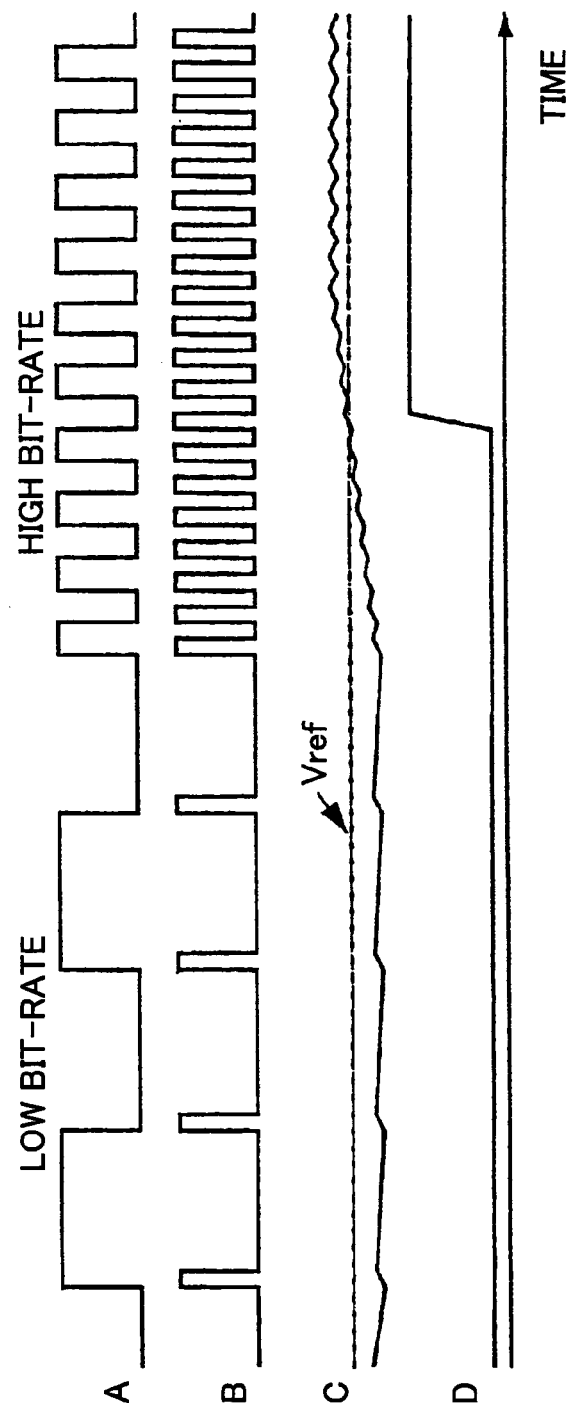
FIG. 2 is a schematic diagram showing the waveforms of the bit-rate discrimination circuit shown in FIG. 1.
Figure 3:
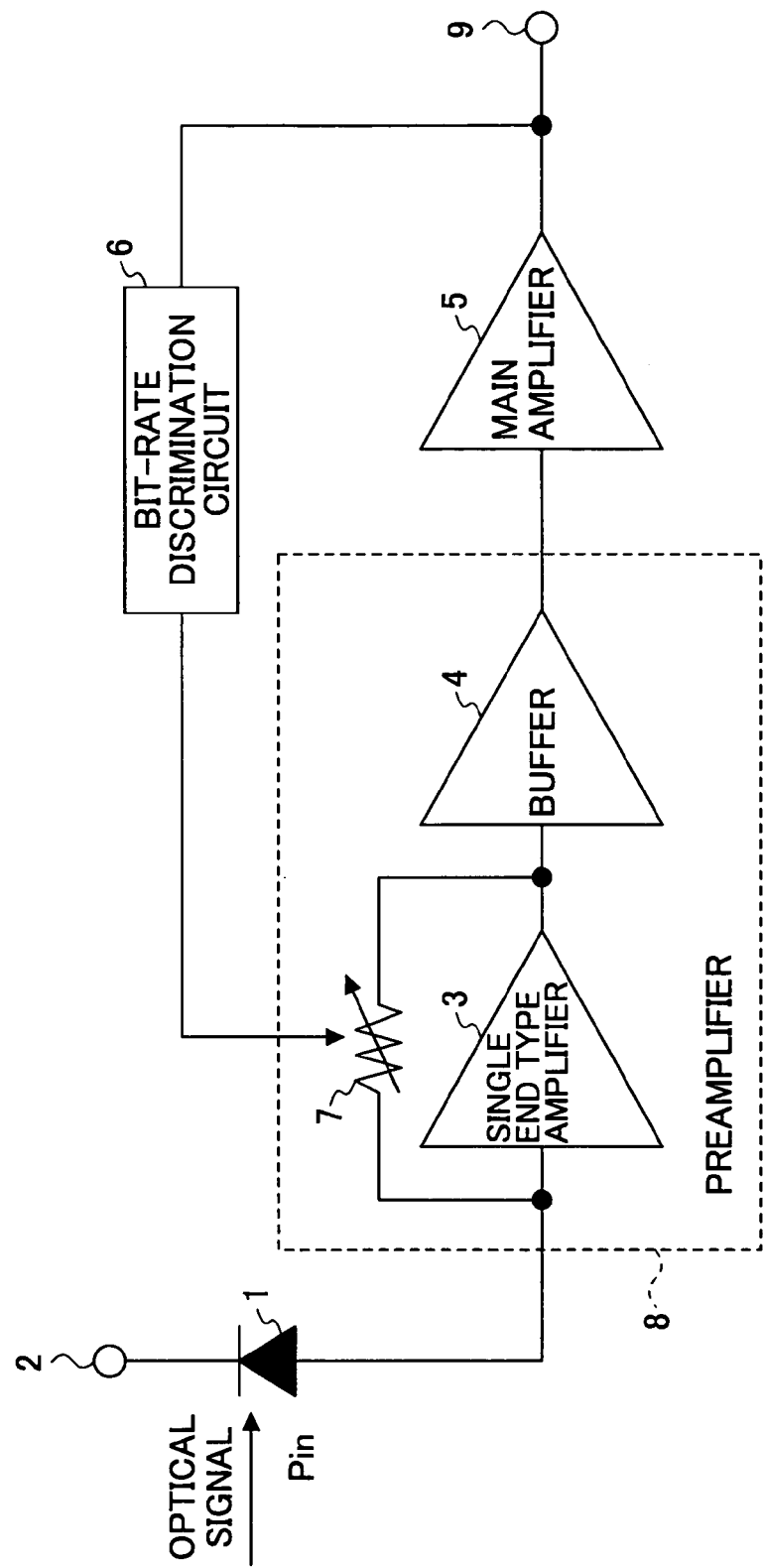
FIG. 3 is a block diagram showing a multi bit-rate receiver using the bit-rate discrimination circuit shown in FIG. 1.

In the case of the multi bit-rate receiver depicted in FIG. 3, the bit-rate discrimination circuit 6 can not discriminate accurately the bit-rate of a signal when the bit-rate of the signal is switched from low speed to high speed. As described above, the conventional bit-rate discrimination circuit discriminates the bit-rate of a signal by detecting the frequency of rise and fall edges of the signal. The band width of the preamplifier 8 is low in low speed mode. If a high bit-rate signal is input to the preamplifier 8, the high frequency component of the signal is lost, and as a result, the bit-rate discrimination circuit 6 can not accurately detect the edges of the signal.

The above problem has been solved by the inventors by providing a bit-rate discrimination circuit that can accurately discriminate the bit-rate of a signal even if the high frequency component of the signal is lost, which is filed as a co-pending PCT international application.

Figure 4:
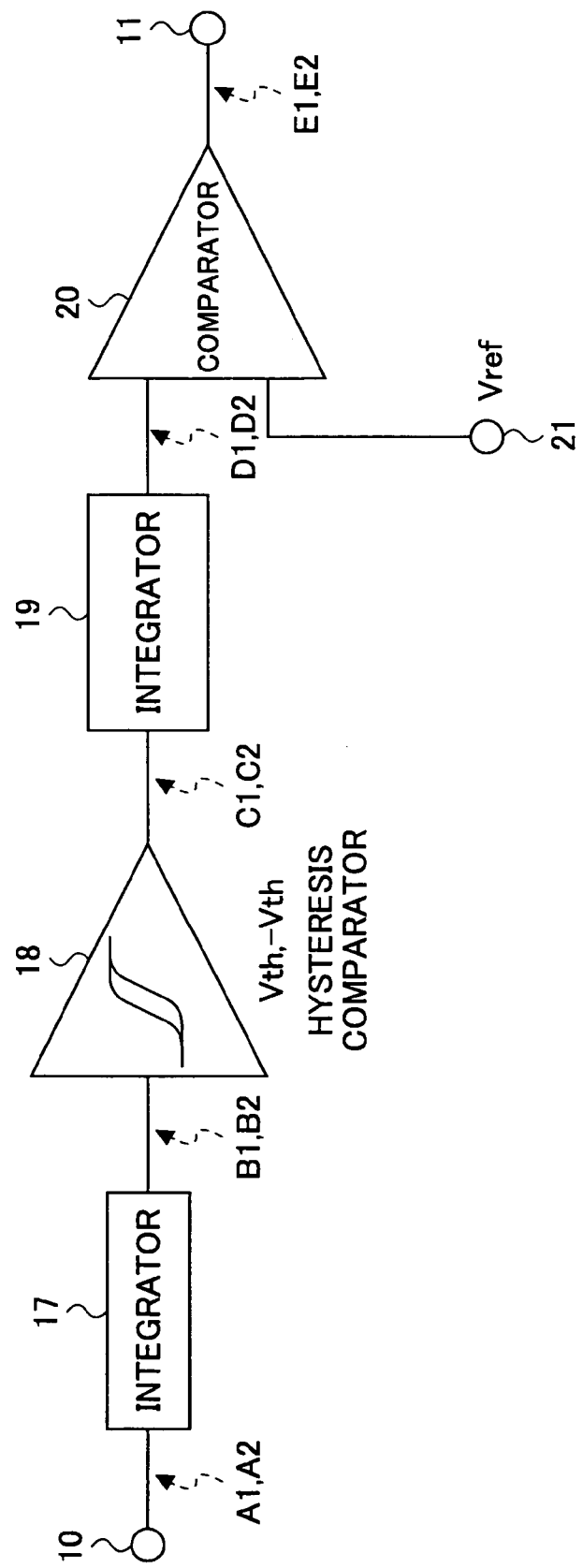
FIG. 4 is a block diagram showing a bit-rate discrimination circuit that can accurately discriminate the bit-rate of a signal even if the high frequency component of the signal is lost.

FIG. 4 shows a bit-rate discrimination circuit that can accurately discriminate the bit-rate of a signal even if the high frequency component of the signal is lost. In FIG. 4, a reference numeral 17 denotes a first stage integrator; 18 denotes a hysteresis comparator; 19 denotes a second stage integrator; 20 denotes a comparator; and 21 denotes an input terminal for a reference voltage ($V_{ref}$).

Figure 5:
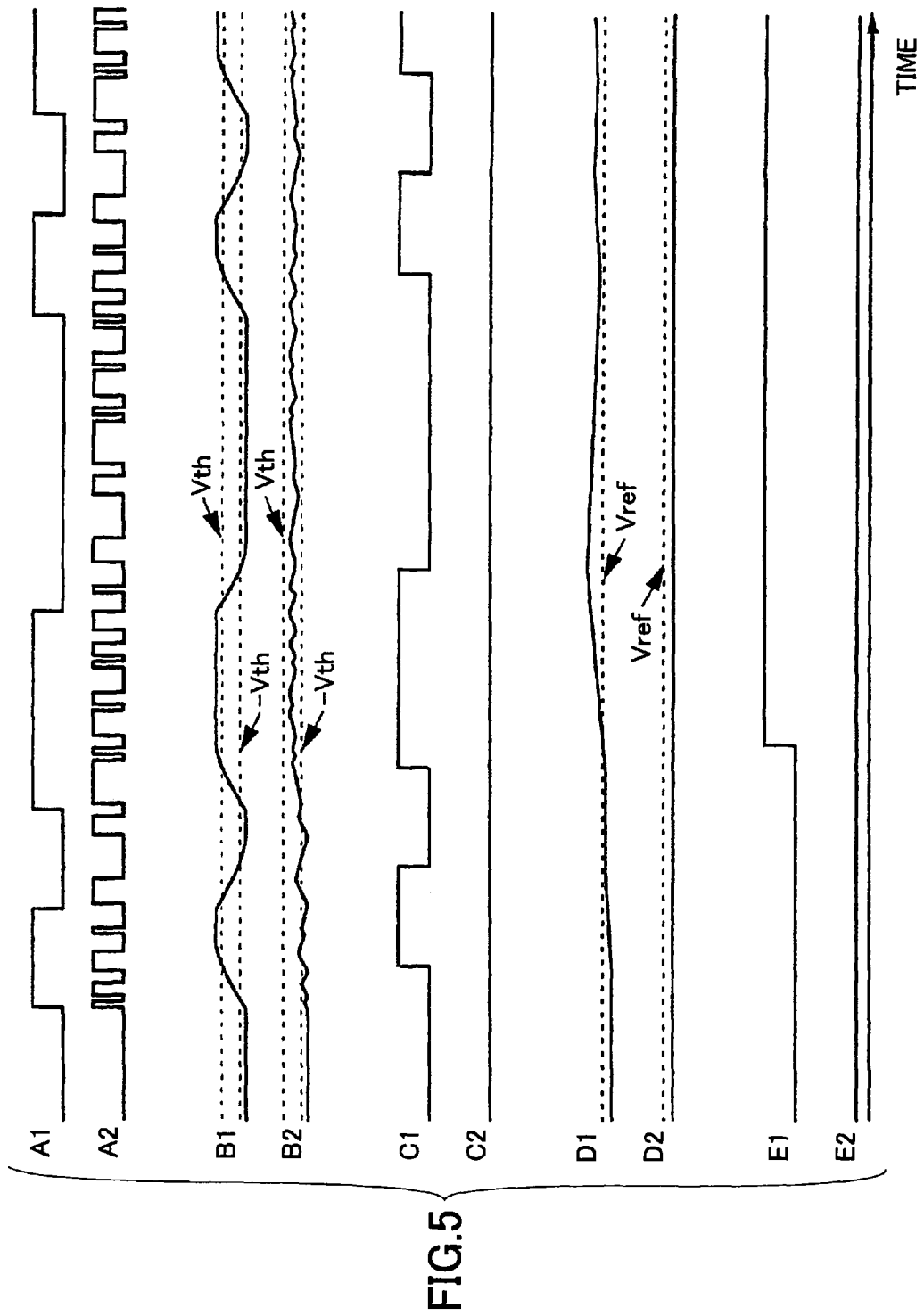
FIG. 5 is a schematic diagram showing waveforms of the bit-rate discrimination circuit shown in FIG. 4.

FIG. 5 shows waveforms for explaining the principle of operation of the bit-rate discrimination circuit shown in FIG. 4. In FIG. 5, A1 shows an input waveform of low bit-rate; A2 shows an input waveform of high bit-rate; B1 shows output waveform from the first stage integrator 17 (in the case of low bit-rate input); B2 shows output waveform from the first stage integrator 17 (in the case of high bit-rate input); C1 shows output waveform from the hysteresis comparator 18 (in the case of low bit-rate input); C2 shows output waveform from the hysteresis comparator 18 (in the case of high bit-rate input); D1 shows output waveform form the second stage integrator 19 (in the case of low bit-rate input); D2 shows output waveform form the second stage integrator 19 (in the case of high bit-rate input); E1 shows output waveform from the comparator 20 (in the case of low bit-rate input); and E2 shows output waveform from the comparator 20 (in the case of high bit rate).

A signal A1 or A2 is fed at an input terminal 10 to the first stage integrator 17. The first stage integrator 17 has a band width such that a high bit-rate signal does not pass, but at least a part of the low frequency component of a low bit-rate signal can pass. When a low bit-rate signal is input, the output B1 shows the rise and fall slopes are degraded, but has sufficiently great amplitude especially in the case of waveform including the low frequency component corresponding to consecutive identical digits. On the other hand, when a high bit-rate signal is input, the output B2 is averaged around the center of the input signal amplitude by the first stage integrator 17, which results insufficient amplitude. The hysteresis comparator 18 is a circuit having two threshold values indicated as $V_{th}$ and $-V_{th}$ in FIG. 5, and if the input voltage is higher than $V_{th}$, the hysteresis comparator 18 outputs a high voltage (high), and if the input voltage is lower than $-V_{th}$, it outputs a low voltage (low). If the input voltage is in between the two threshold values, the hysteresis comparator 18 does nothing but maintain its previous state. When the input signal is of low bit-rate, and the output B1 from the first stage integrator 17 is fed, the output C1 from the hysteresis comparator 18 switches between high and low frequently. However, when the input signal is of high bit-rate, and the output B2 from the first stage integrator 17 is fed, the output C2 from the hysteresis comparator 18 remain at the initial low state. If the band width of the second stage integrator 19 is selected to be substantially lower than that of the first stage integrator 17, the second stage integrator 19 can output averaged voltage of the input signals C1 and C2. When the input signal is of low bit-rate, the hysteresis comparator performs switching operation, the output signal D1 has certain average voltage. When the input signal is of high bit-rate, the output C2 of the hysteresis comparator 18 remains low, resulting in that the output signal D2 of the second stage integrator 19 also remains low. If the reference voltage ($V_{ref}$) is set at a voltage between the output voltages D1 and D2, and fed to the comparator 20, when D1 is input, the comparator 20 outputs high voltage (E1), and when D2 is input, the comparator 20 outputs low voltage (E2).

This discrimination technique detects the presence of the low frequency component of a signal to be discriminated. According to this arrangement, even if the high frequency component of a signal input to the bit-rate discrimination circuit is lost, the bit-rate discrimination circuit can discriminate the bit-rate of the signal accurately.

However, even if the bit-rate discrimination circuit shown in FIG. 4 is simply applied to the bit-rate automatic control circuit as shown in FIG. 3, there still remain a problem that the bit-rate automatic control circuit can not respond to the change in the minimum acceptable value of received power ($P_{min}$) caused by the mode change of the preamplifier 8. (The reception level of the preamplifier is convertible to an optical input level in dependence on the conversion efficiency of a photoelectric conversion device such as a photo diode. In the following description for simplicity, the received optical power is used for corresponding reception level, and the minimum acceptable value of received power of the photo detector is used for corresponding minimum acceptable value of received power.) Specifically, if optical input level ($P_{in}$) is equal to or more than the minimum acceptable value of received power ($P_{minL}$) in the low speed mode and less than the minimum acceptable value of received power ($P_{minH}$) ($P_{minL} \leq P_{in} < P_{minH}$), in the case in which the bit-rate of the input signal switched from high to low, the advantage of the bit-rate discrimination circuit shown in FIG. 4 cannot be fully utilized. This is because the input signal level is lower than the minimum acceptable value of received power, and as a consequence, the signal is buried in noise, and the bit-rate discrimination circuit (FIG. 4) can not accurately discriminate the bit-rate.

In particular, if the bit-rate discrimination circuit as shown in FIG. 4 is used, if the optical input level is higher than the minimum acceptable value of received power in low bit-rate mode and lower than the minimum acceptable value of received power in high bit-rate mode, the amplitude of the input signal to the bit-rate discrimination circuit is reduced, which leads to erroneous determination that the bit-rate is high. Even if the bit-rate of the input signal is turned to low bit-rate, the discrimination of the bit-rate discrimination circuit is fixed to the high speed mode.

FIG. 7 shows the ideal discrimination result of a bit-rate discrimination circuit upon the switching operation of the bit-rate of an input signal for each optical signal input level. In FIG. 7, "- - -" indicates that the optical signal of which input level is lower than the minimum acceptable value of received power can not be received. FIG. 8 shows the discrimination result of the bit-rate discrimination circuit (Patent Document 1) upon the switching operation of the bit-rate of an input signal for each optical signal input level. Even if $P_{in}$ is equal to or more than $P_{minH}$, this bit-rate discrimination circuit can not accurately discriminate a high bit-rate signal in the low speed mode (in FIG. 8, this situation is indicated by "?"). FIG. 9 shows the discrimination result of the bit-rate discrimination circuit shown in FIG. 4 upon the switching operation of the bit-rate of an input signal for each optical signal input level. Because the bit-rate discrimination circuit determines all signals lower than the minimum acceptable value of received power to be of high bit-rate, even if the input signal is switched from high bit-rate to low bit-rate when $P_{minL} \leq P_{in} < P_{minH}$.

One object of the present invention is to provide a bit-rate automatic control circuit in which the power level of an optical signal is determined as well as discriminating the bit-rate of the optical signal, and the feedback resistor can be controlled in accordance with the result of the above determination and discrimination. In the case in which the optical input level is equal to or higher than the minimum acceptable value of received power in the low speed mode and lower than the minimum acceptable value of received power in the high speed mode, even if the optical input signal is switched from high bit-rate to low bit-rate, the above arrangements allows the bit-rate automatic control circuit to give accurate discrimination result of the bit-rate.

The preferred embodiments of the present invention are elucidated in connection with the drawings.

The present invention realizes a bit-rate automatic control circuit that can accurately discriminate the bit-rate. The bit-rate automatic control circuit uses the determination obtained by an alarm circuit that detects the power level of an input optical signal, and switches its output voltage in dependence on the minimum acceptable value of received power of a multi bit-rate receiver as a reference. The bit-rate automatic control circuit also uses the discrimination obtained by a bit-rate discrimination circuit that discriminates whether the bit-rate is high or low. If the determination obtained by the alarm circuit indicates that the power level of the input optical signal is lower than the minimum acceptable value of received power, the multi bit-rate receiver is forced to switch to the low speed mode. Otherwise, the multi bit-rate receiver is switched to the low speed mode or the high speed mode using the discrimination result obtained by the bit-rate discrimination circuit.

First Embodiment

Figure 10:
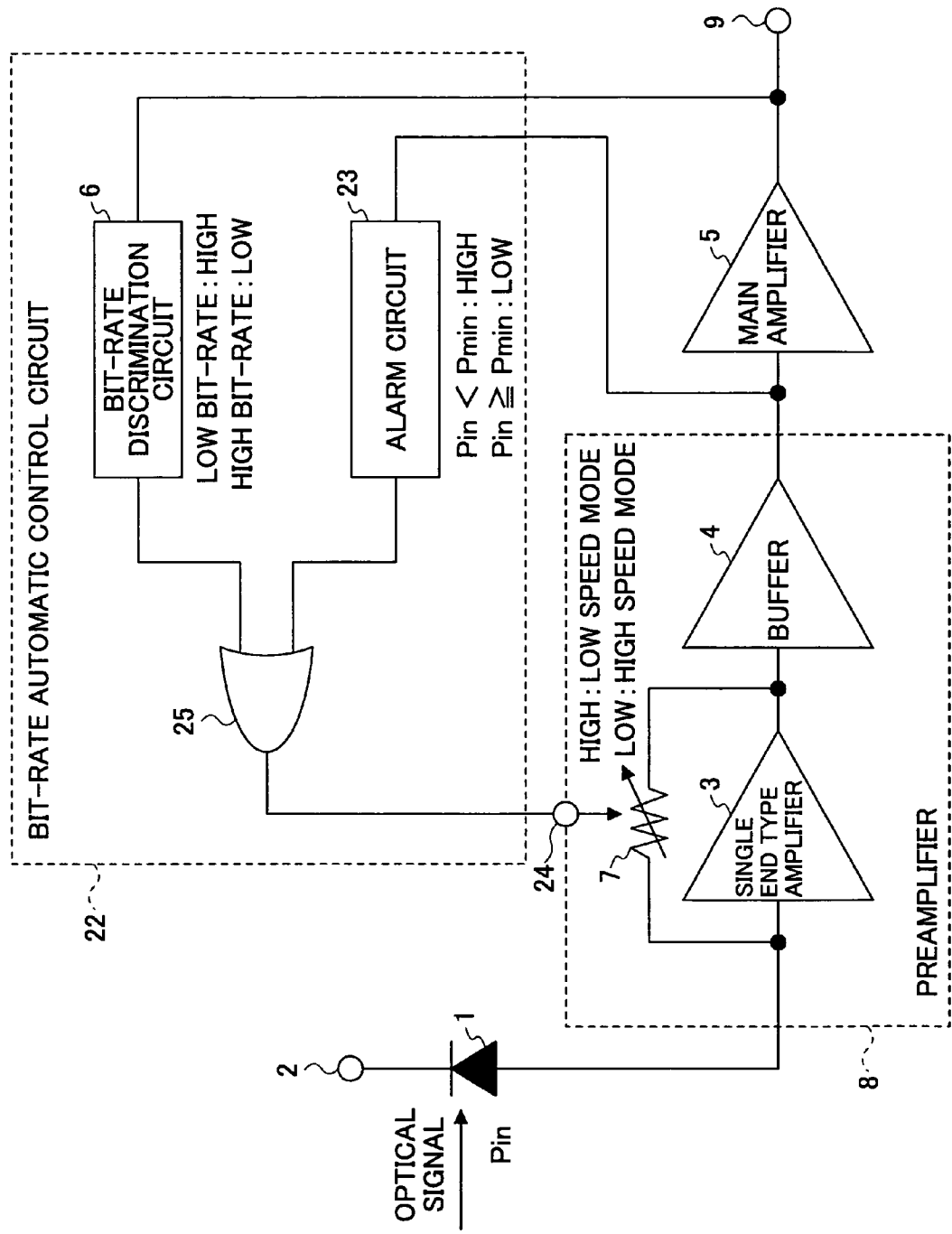
FIG. 10 is a block diagram showing a multi bit-rate receiver according to a first embodiment of the present invention.

FIG. 10 is a block diagram showing a multi bit-rate discrimination circuit according to a first embodiment of the present invention. In FIG. 10, the same reference symbol as used in FIG. 3 denotes a similar component. A reference numeral 22 denotes a bit-rate automatic control circuit; 23 denotes an alarm circuit; 24 denotes a control terminal for switching feedback resistors; and 25 denotes a dual input OR circuit.

Figure 11:
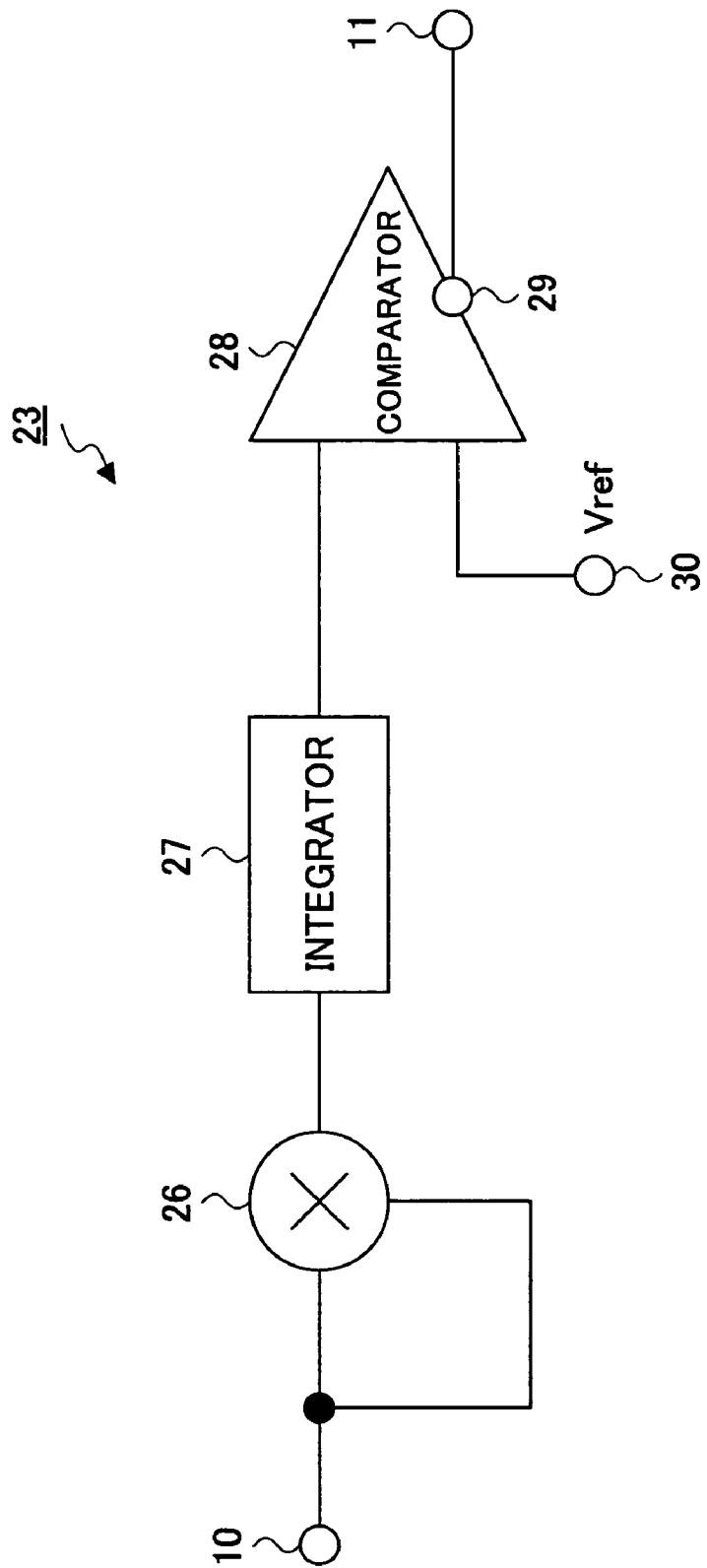
FIG. 11 is a block diagram showing an alarm circuit.

FIG. 11 shows an example of the alarm circuit 23. In FIG. 11, the same reference symbol as used in FIG. 4 denotes a similar component. A reference numeral 26 denotes a multiplier; 27 denotes an integrator; 28 denotes a comparator; 29 denotes an inverted output terminal of the comparator 28; and 30 denotes an input terminal for a reference voltage ($V_{ref}$).

The alarm circuit 23 is a circuit for converting the amplitude of an input signal into the voltage of an output signal. The input signal is fed to the multiplier 26, and is integrated by the integrator 27. The reference voltage $V_{ref}$ of the comparator 28 is selected in dependence on the input level of the comparator 28 corresponding to the minimum acceptable value of received power ($P_{min}$) of an optical input signal ($P_{in}$). An inverted output is used. The alarm circuit 23 outputs high voltage for an optical signal input lower than the minimum acceptable value of received power ($P_{in} < P_{min}$), and outputs low voltage otherwise ($P_{in} \geq P_{min}$). If the band width of the comparator 28 is similar to that of the integrator 27, the integrator 27 may be omitted.

In the following description, it is assumed that if the input signal is determined to be of low bit-rate, the bit-rate discrimination circuit 6 outputs high level, and if the input signal is determined to be of high bit-rate, the bit-rate discrimination circuit 6 outputs low level. It is further assumed that, if a high voltage is input through a control terminal 24 for switching the feedback resistor, the preamplifier 8 is switched to the low speed mode, and if a low voltage is input, the preamplifier 8 is switched to the high speed mode.

If the output of the alarm circuit 23 is low, that is, the optical input signal level is equal to or higher than the minimum acceptable value of received power ($P_{in} \geq P_{min}$), the output of the dual input OR circuit 25 is determined by the output of the bit-rate discrimination circuit 6. Therefore, if the input signal is of low bit-rate, the preamplifier 8 is switched to the low speed mode, and if the input signal is of high bit-rate, the preamplifier 8 is switched to the high speed mode. If the output of the alarm circuit 23 is high, that is, the optical input signal level is lower than the minimum acceptable value of received power ($P_{in} < P_{min}$), the output of the dual input OR circuit 25 remains at high level regardless of the output of the bit-rate discrimination circuit 6. Therefore, the preamplifier 8 is switched to the low speed mode. If the optical input is equal to or higher than the minimum acceptable value of received power of the low speed mode, and lower than the minimum acceptable value of received power of the high speed mode ($P_{minL} \leq P_{in} < P_{min}$), even if the bit-rate is switched from high to low, the preamplifier 8 has been already switched to the low speed mode when the high bit-rate is received. Thus, when the input optical signal is switched to low bit-rate, the bit-rate discrimination circuit 6 can discriminate the bit-rate accurately. At the same time, the alarm circuit 23 outputs low level and consequently, the preamplifier 8 remains at the low speed mode as a result of the discrimination by the bit-rate discrimination circuit 6.

If a signal has opposite polarity, the signal may be fed through an inverter or an inverted amplifier, for example, or fed to an inverted input terminal, if available.

Figure 12:
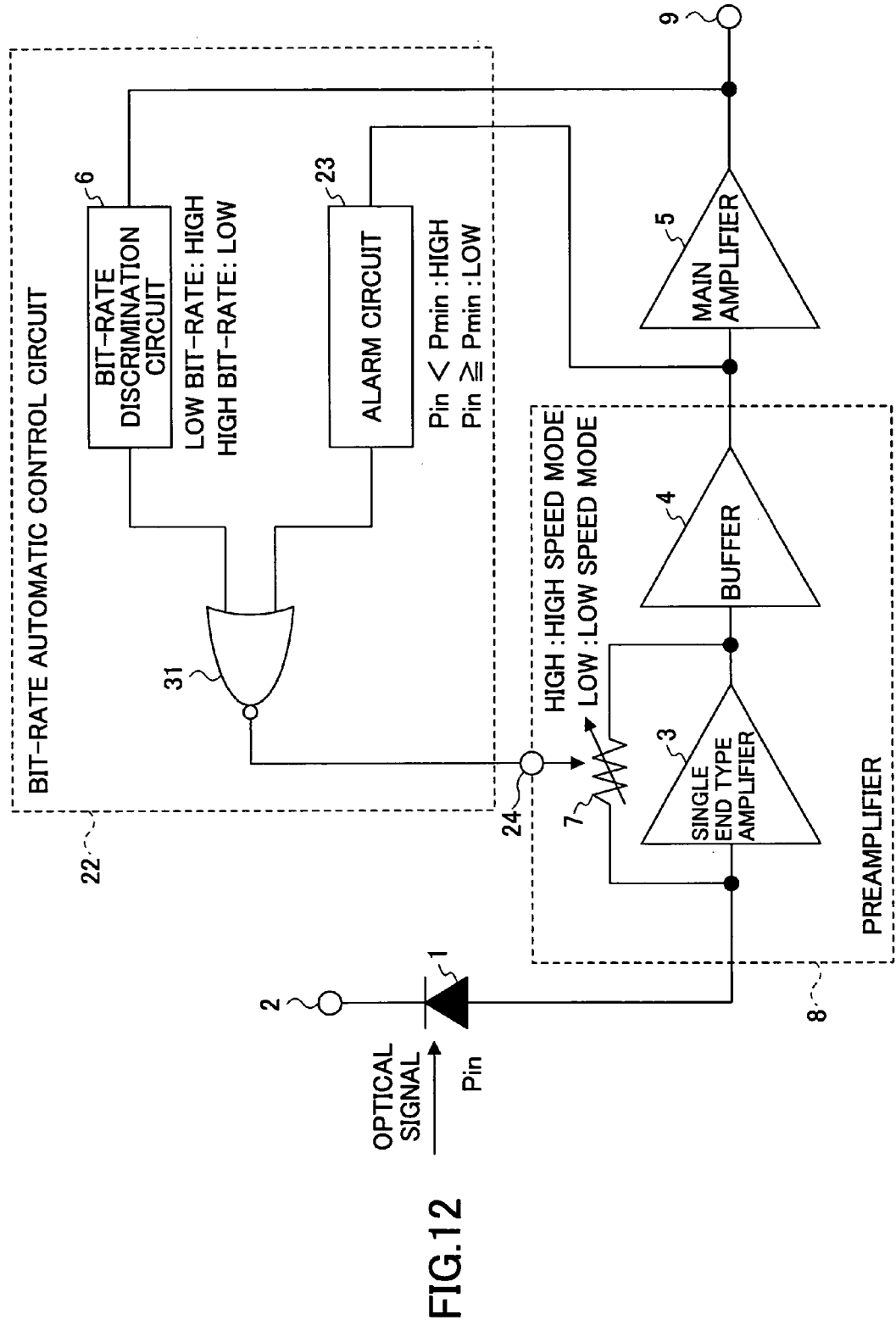
FIG. 12 is a block diagram showing a multi bit-rate receiver according to a first variation of the first embodiment.

FIG. 12 is a block diagram showing a multi bit-rate receiver according to a first variation of the first embodiment. In FIG. 12, the same reference symbol as used in FIG. 10 denotes a similar component. A reference numeral 31 denotes a dual input negative OR circuit. It is clear that the output of the bit-rate automatic control circuit according to this variation is the inversion of the output of the bit-rate automatic control circuit according to the first embodiment. This variation of the first embodiment is applicable to the case in which, if high voltage is fed to the control terminal 24 for switching the feedback resistor of the preamplifier 8, the preamplifier 8 is turned to the high speed mode, and if low voltage is fed, the preamplifier 8 is turned to the low speed mode.

Figure 13:
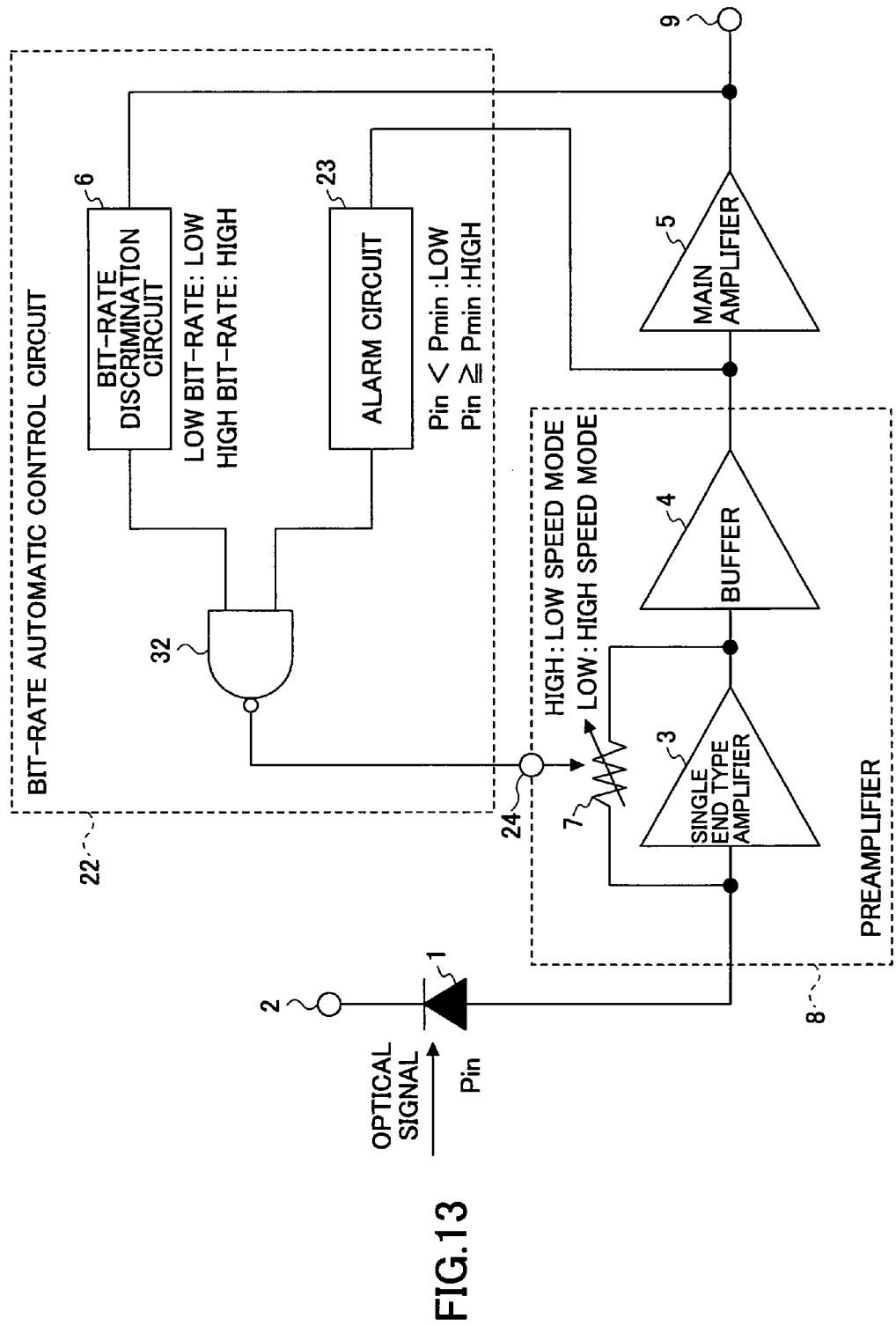
FIG. 13 is a block diagram showing a multi bit-rate receiver according to a second variation of the first embodiment.

FIG. 13 is a block diagram showing a multi bit-rate receiver according to a second variation of the first embodiment. In FIG. 13, the same reference symbol as used in FIG. 10 denotes a similar component. A reference numeral 32, denotes a dual input negative AND circuit. If the polarity of the output from the alarm circuit 23 and the output of the bit-rate discrimination circuit 6 is opposite to that shown in FIG. 10 (If low bit-rate is determined, the output of the bit-rate discrimination circuit 6 is low, and if high bit-rate is determined, the output of the bit-rate discrimination circuit 6 is high. If $P_{in} < P_{min}$, the output of the alarm circuit 23 is low, and if $P_{in} \geq P_{min}$, the output of the alarm circuit 23 is high.), then the negative AND circuit 32 is used instead of the dual input OR circuit 25 taking de Morgan's theorem in consideration, which leads to the same result.

Figure 14:
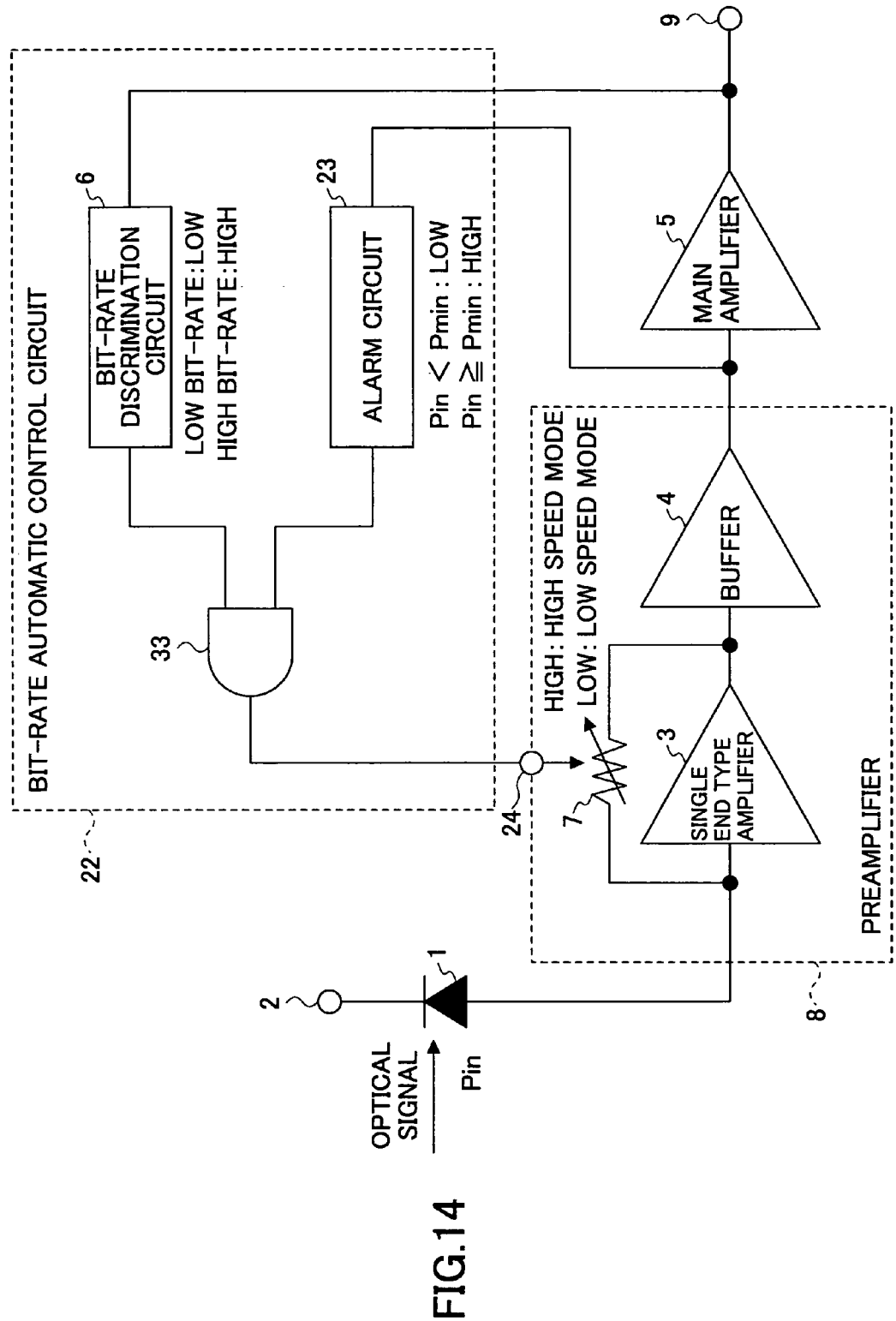
FIG. 14 is a block diagram showing a multi bit-rate receiver according to a third variation of the first embodiment.

FIG. 14 is a block diagram showing a multi bit-rate receiver according to a third variation of the first embodiment. In FIG. 14, the same reference symbol as used in FIG. 10 denotes a similar component. A reference numeral 33 denotes a dual input AND circuit. It is evident that the output of the bit-rate automatic control circuit according to this variation is opposite to the output of the bit-rate automatic control circuit shown in FIG. 13. This variation is applicable to the case in which if high level is fed to the control terminal 24 for switching the feedback resistor of the preamplifier 8, the preamplifier 8 is set to the high speed mode, and if low level is fed, the preamplifier 8 is set to the low speed mode.

Figure 15:
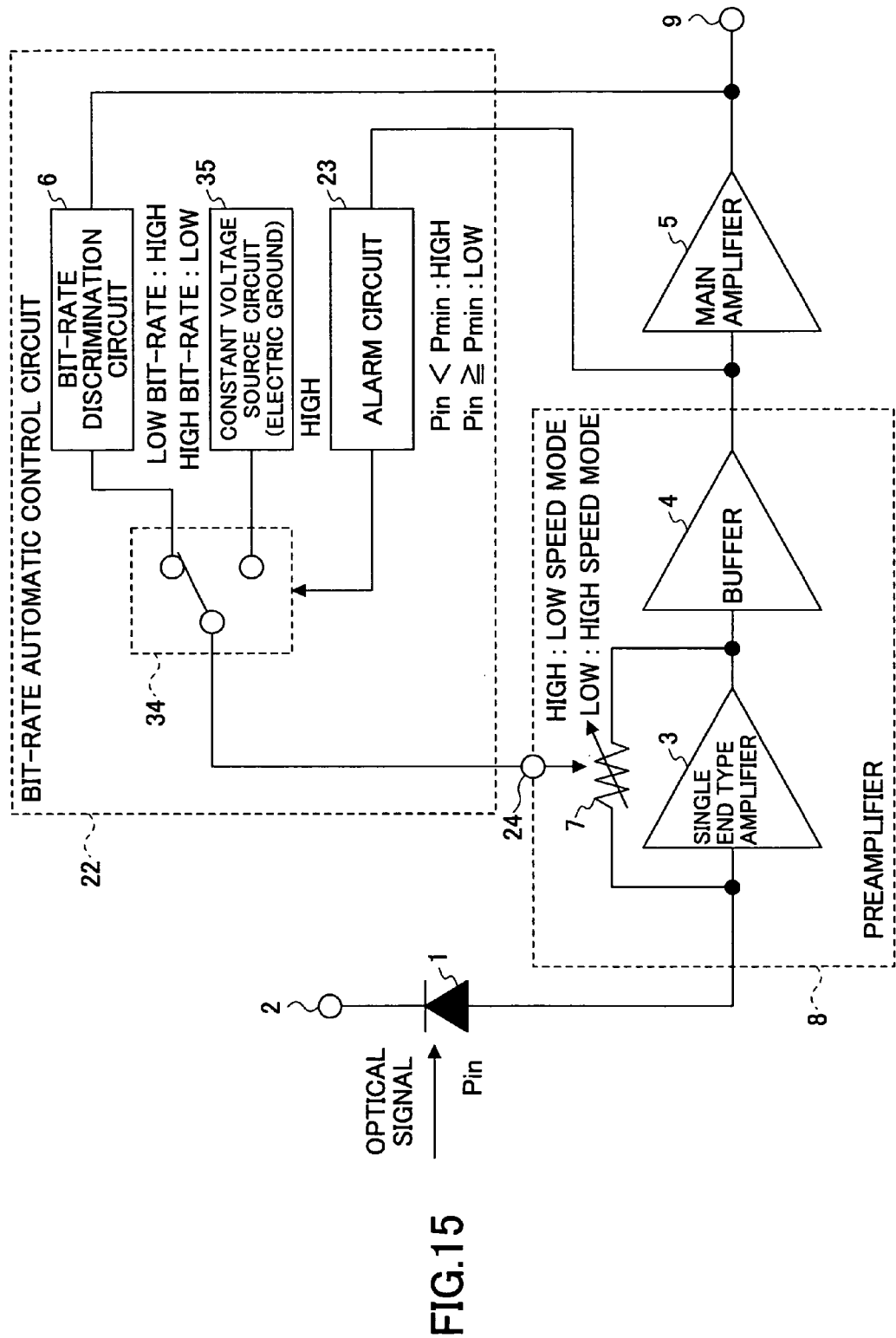
FIG. 15 is a block diagram showing a multi bit-rate receiver according to a fourth variation of the first embodiment.

FIG. 15 is a block diagram showing a multi bit-rate receiver according to a fourth variation of the first embodiment. In FIG. 15, the same reference symbol as used in FIG. 10 denotes a similar component. A reference numeral 34 denotes a switch, 35 denotes a constant voltage source circuit or grounding. It is noted that the switch 34 is used in the present variation instead of the dual input OR circuit as used in FIG. 10. If the alarm circuit 23 determines that the optical signal input level is below the minimum acceptable value of received power, the switch 34 switches to the constant voltage source circuit or the grounding 35, which are the same voltage as the output of the bit-rate discrimination circuit 6 for low bit-rate signal input. If a determination is made that the optical signal input level is equal to or higher than the minimum acceptable value of received power, the switch 34 switches to the output of the bit-rate discrimination circuit 6. According to the above arrangements, the fourth variation realizes the similar function to the multi bit-rate automatic control circuit according to the first embodiment.

Figure 16:
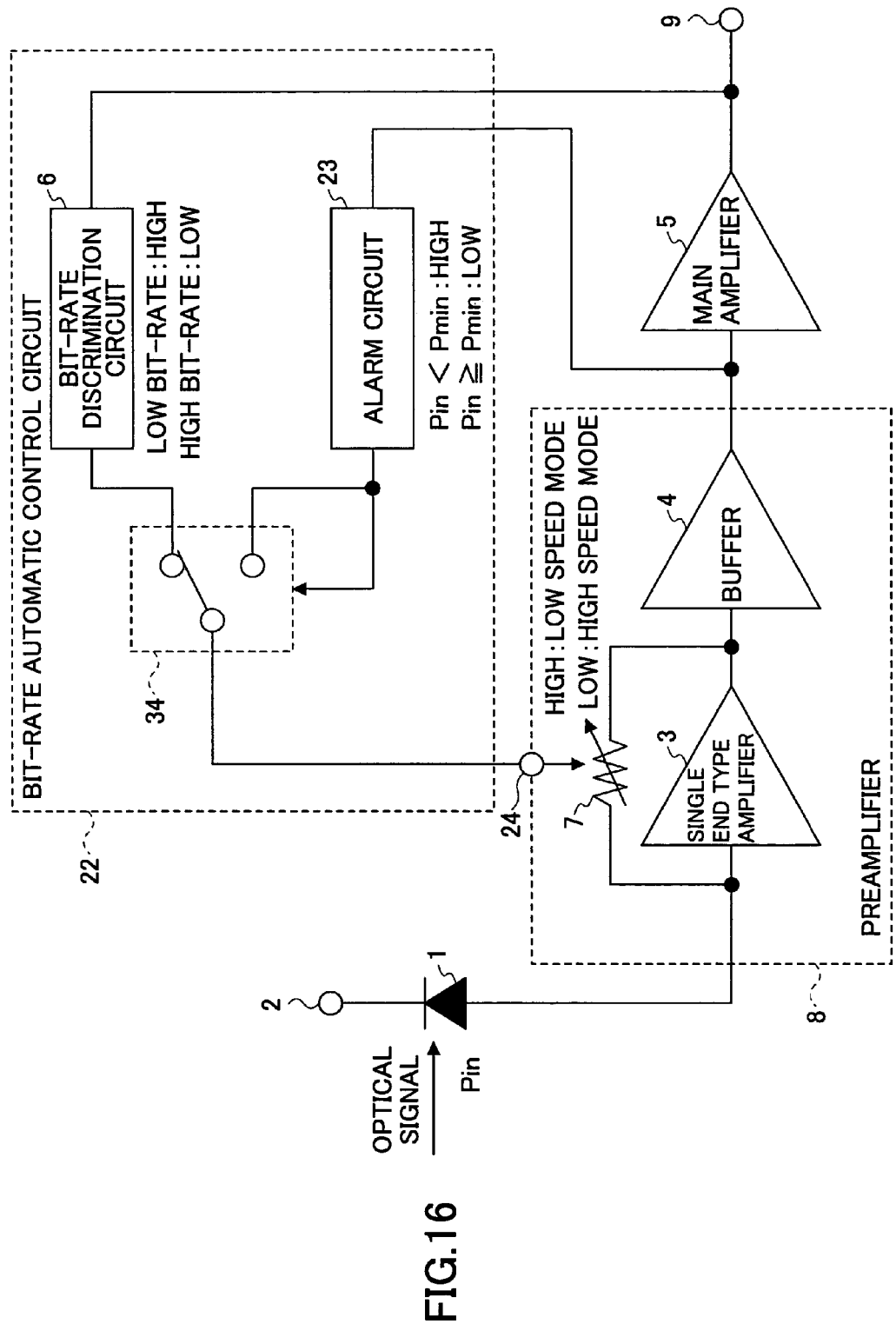
FIG. 16 is a block diagram showing a multi bit-rate receiver according to a fifth variation of the first embodiment.

FIG. 16 is a block diagram showing a multi bit-rate receiver according to a fifth variation of the first embodiment. In FIG. 16, the same reference symbol as used in FIG. 15 denotes a similar component. The exemplary multi bit-rate receiver shown in FIG. 15 uses the constant voltage source circuit or grounding 35. The output of the alarm circuit 23 may be used as shown in FIG. 16 to obtain the similar result.

If a signal having opposite polarity to that shown herein is used, an inverter or an inverted amplifier may be used for inverting the polarity of the signal, or an inverted input terminal, if differential type, may be used for feeding the signal.

Figure 17:
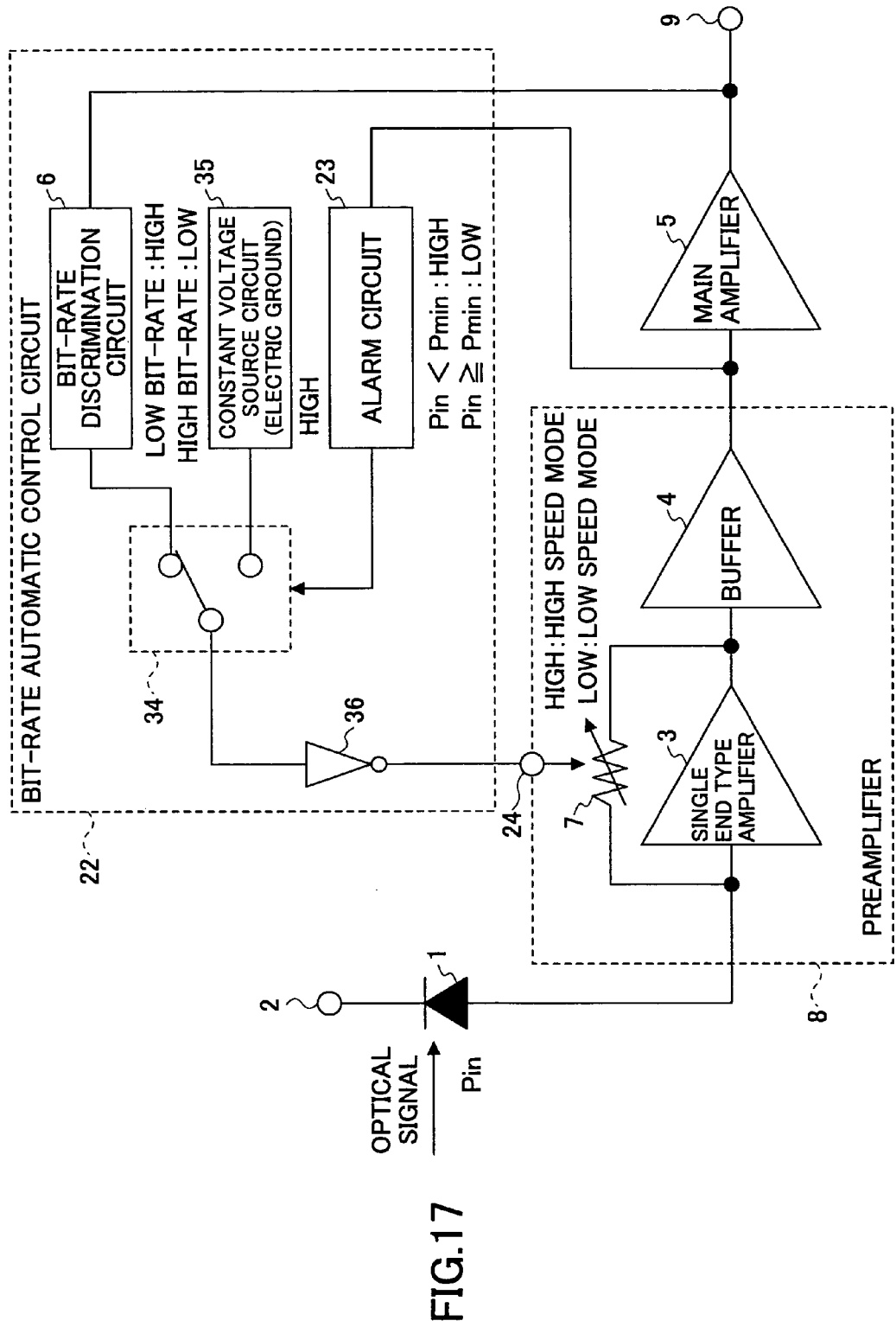
FIG. 17 is a block diagram showing a multi bit-rate receiver according to a sixth variation of the first embodiment.

FIG. 17 is a block diagram showing a multi bit-rate receiver according to a sixth variation of the first embodiment. In FIG. 17, the same reference symbol as used in FIG. 15 denotes a similar component. A reference numeral 36 denotes an inverter. It is apparent that the output of the bit-rate automatic control circuit according to this variation is opposite to that of the bit-rate automatic control circuit shown in FIG. 15. This variation is applicable to the case in which if high voltage is input to the control terminal 24 for switching the feedback resistor of the preamplifier 8, the preamplifier 8 is set to the high speed mode, and if low voltage is input to the control terminal 24, the preamplifier 8 is set to the low speed mode.

Although the present variation is described as the multi bit-rate receiver according to the fourth variation (shown in FIG. 15) plus the inverter 36 for convenience, the present variation may be the multi bit-rate receiver according to the fifth variation (shown in FIG. 16) of which mode is inverted plus the inverter 36. In addition, the fourth through sixth variations (shown in FIGS. 15-17) is effectively applicable to the case in which all of the output of the bit-rate discrimination circuit 6, the output of the alarm circuit 23, the output of the constant voltage source circuit or the grounding 35, the input of the control terminal 24 for switching the feedback resistor of the preamplifier 8 have inverted polarity.

Figure 18:
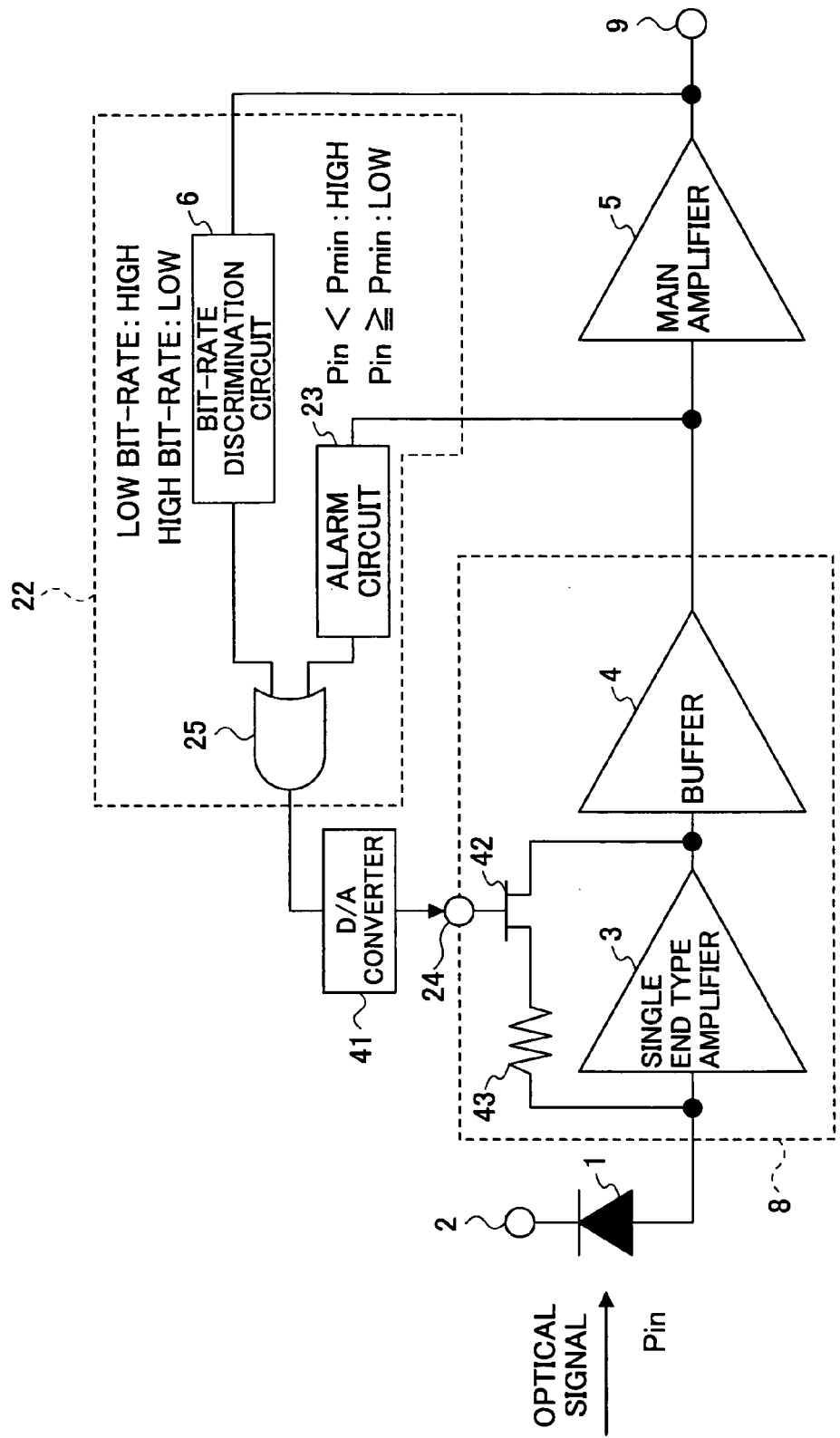
FIG. 18 is a block diagram showing a multi bit-rate receiver according to a seventh variation of the first embodiment.

FIG. 18 is a block diagram showing a multi bit-rate receiver according to a seventh variation of the first embodiment. In FIG. 18, the same reference symbol as used in FIG. 10 denotes a similar component. A reference numeral 41 denotes a D/A converter; 42 denotes a variable resistor or a variable resistor element; and 43 denotes a feedback resistor. The mechanism for switching the gain and band width of the preamplifier shown in FIG. 18 changes the variable resistor 42 consisting of the feedback resistor 7 using the input signal as an analog signal. If the output of the bit-rate is converted into an analog signal by the D/A converter 41 so that the desired gain and band width can be obtained, the similar function can be realized.

Figure 19:
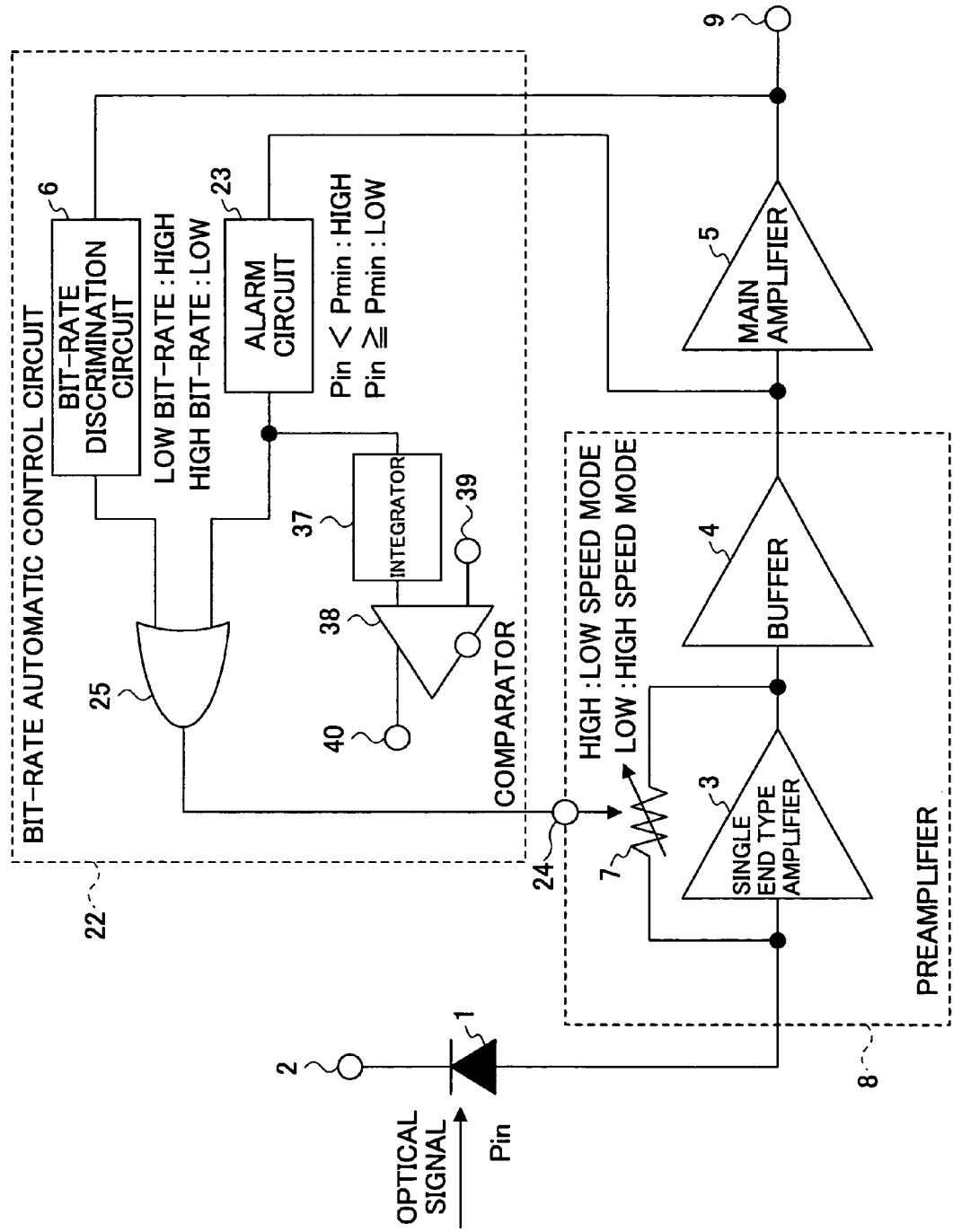
FIG. 19 is a block diagram showing a multi bit-rate receiver according to a eighth variation of the first embodiment.

FIG. 19 is a block diagram showing a multi bit-rate receiver according to a seventh variation of the first embodiment. In FIG. 19, the same reference symbol as used in FIG. 10 denotes a similar component. A reference numeral 37 denotes an integrator; 38 denotes a comparator; 39 denotes an input terminal for a reference voltage of the comparator; and 40 denotes an alarm output terminal. If a signal that has $P_{in}$ being $P_{minL} \leq P_{in} < P_{minH}$ and high bit-rate is input, the bit-rate automatic control circuit according to the present invention keeps switching between the low speed mode and the high speed mode. In the low speed mode, the alarm circuit 23 determines that the signal is higher than the minimum acceptable value of received power, and the bit-rate discrimination circuit 6 determines that the signal is of high bit-rate. Consequently, the preamplifier is switched to the high speed mode. However, because of the high speed mode, the alarm circuit 23 determines that the signal is below the minimum acceptable value of received power, and the preamplifier is forced to return to the low speed mode. As a result, the mode goes back and forth between the low speed mode and the high speed mode. The alarm circuit 23 also outputs high voltage and low voltage alternately. Since this optical signal is not strong enough to be detected, it is preferred that the alarm circuit determines that the signal is below the minimum acceptable value of received power.

For the above purpose, a bit-rate automatic control circuit according to the present variation is provided with a stabilization circuit for the alarm output comprising the integrator 37 and the comparator 38 at the output of the alarm circuit 23. If the alarm circuit 23 alternately outputs high voltage and low voltage, an alarm signal indicating that the received power of the optical signal is below the minimum acceptable value is output through the alarm output terminal 40 so that the operation of the alarm circuit is stabilized. If the band width of the comparator 38 is equivalent with that of the integrator 37, the integrator 37 may be omitted. The present variation is described as the multi bit-rate receiver according the first embodiment plus the integrator 37 and the comparator 39, but the present variation is also applicable to the first through seventh variations of the first embodiment or to the second embodiment to be described below in the same manner.

In the multi bit-rate receivers according to the first embodiment of the present invention and its variations described above, the input terminal of the alarm circuit 23 is connected to the output terminal of the preamplifier 8. However, the input to the alarm circuit 23 may be taken from an internal terminal of the preamplifier 8 or an internal terminal of the main amplifier 5, for example, as long as the internal terminal shows linear response to an input in the neighborhood of the minimum acceptable value of received power. In the first embodiment and its variations described above, the alarm circuit 23 is described as an independent circuit component. However, the alarm circuit 23 may be a part of the preamplifier 8 or the main amplifier 5.

FIG. 6 shows the determination made by the bit-rate automatic control circuit according to the present invention for each combination of the bit-rate of the input signal and input level of the input signal. In FIG. 6, "high/low" indicates that the mode is switched between the low speed mode and the high speed mode. FIG. 6 shows that the bit-rate automatic control circuit according to the present invention determines the right mode for an optical signal higher than the minimum acceptable value of received power.

The elements used for the present invention, namely, the alarm circuit 23, the bit-rate discrimination circuit 6, the dual input OR circuit 25, the dual input negative OR circuit 31, the dual input negative AND circuit 32, the dual input AND circuit 33, the switch 34, the constant voltage source circuit or grounding 35, the inverter 36, the integrator 37, the comparator 38, may be any suitable components that operate in the same manner as described above.

As described above, the bit-rate automatic control circuit according to the present invention uses both the determination made by the alarm circuit of whether the optical input signal level is lower than the minimum acceptable value of received power of the multi bit-rate receiver or not, and the discrimination made by the bit-rate discrimination circuit of the bit-rate of the optical input signal. If the alarm circuit determines that the optical input signal level is lower than the minimum acceptable value of received power, the bit-rate automatic control circuit is forced to output a control signal indicating that the optical input signal is of low bit-rate, and otherwise the bit-rate automatic control circuit outputs a control signal in dependence on the discrimination made by the bit-rate discrimination circuit. In the case in which the optical input signal level is equal to or higher than the minimum acceptable value of received power in the low speed mode and lower than the minimum acceptable value of received power in the high speed mode, and the bit-rate of the optical input signal changes from high bit-rate to low bit-rate, the preamplifier is switched to the low speed mode when the high bit-rate is received. Thus, even if the optical input signal is switched to low bit-rate, the bit-rate of the optical input signal can be discriminated accurately. At the same time, the alarm circuit allows the output of the bit-rate automatic control circuit to remain the low speed mode. Therefore, the multi bit-rate receiver operates accurately.

Second Embodiment

Figure 20:
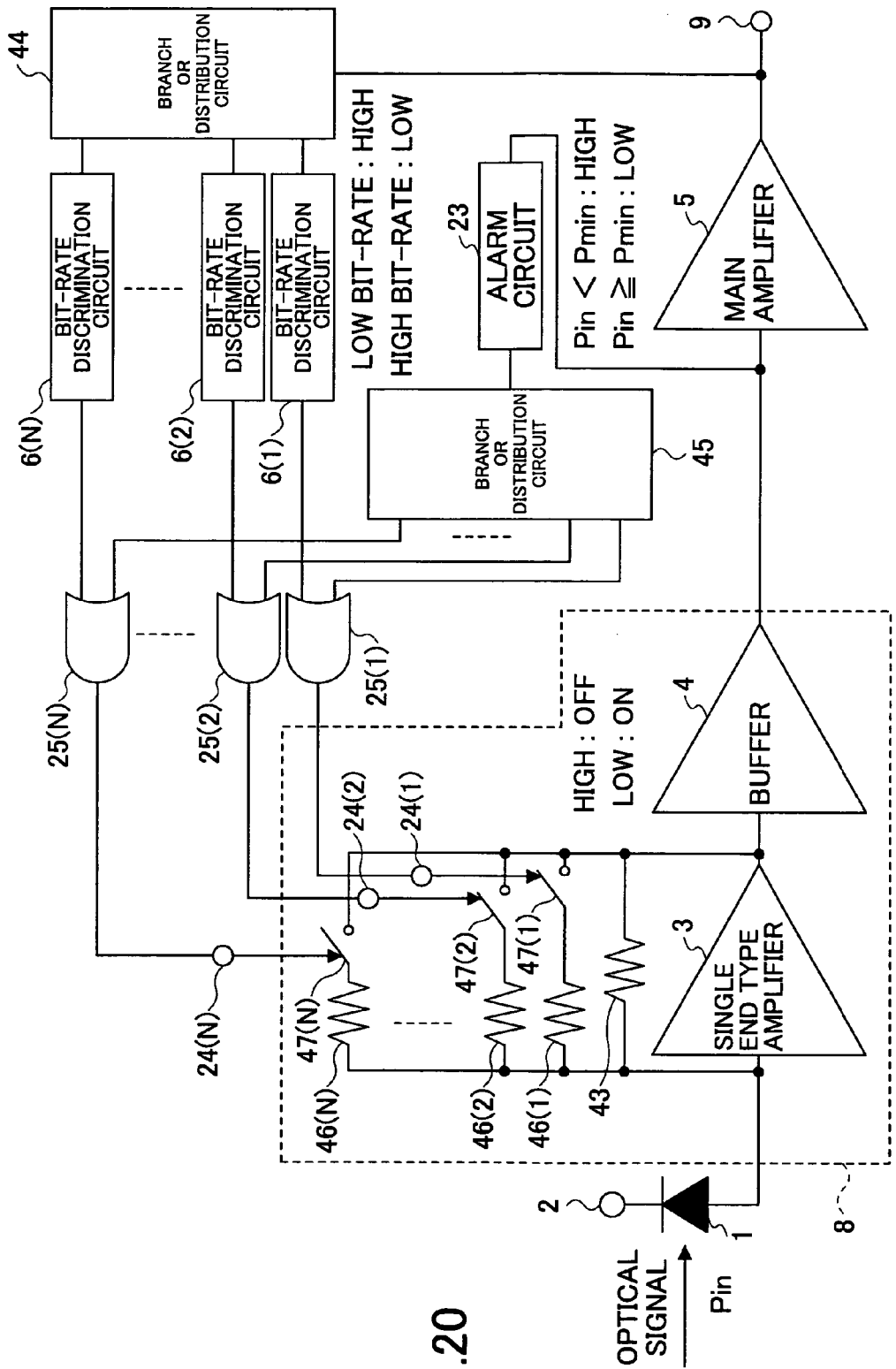
FIG. 20 is a block diagram showing a multi bit-rate receiver according to a second embodiment of the present invention.
Figure 21:
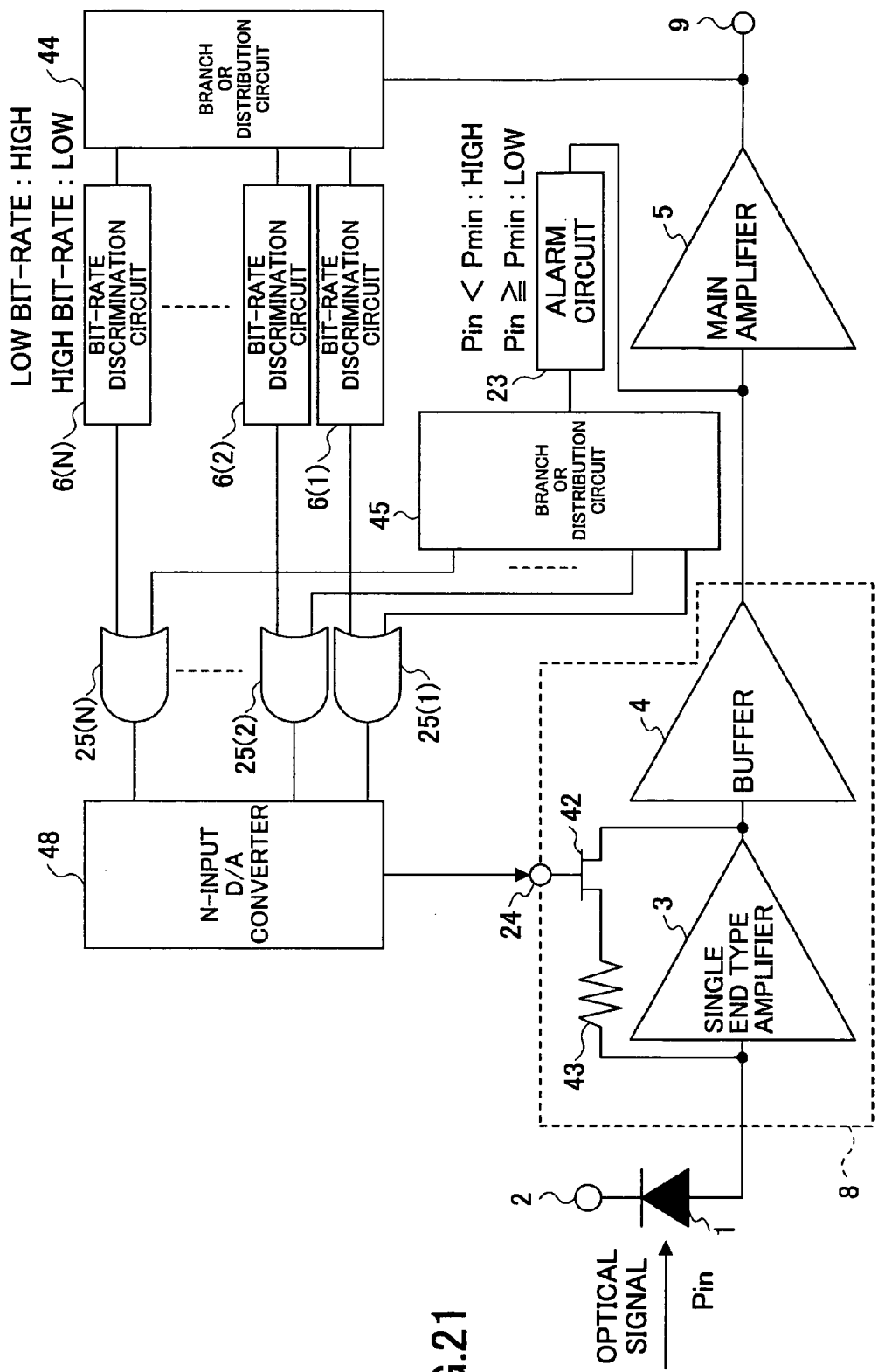
FIG. 21 is a block diagram showing a multi bit-rate receiver according to a variation of the second embodiment.

Referring to FIGS. 20 and 21, the second embodiment of the present invention is described below.

FIG. 20 is a block diagram showing a multi bit-rate receiver according to the second embodiment of the present invention. In FIG. 20, the same reference symbol as used in FIG. 10 denotes a similar component. Reference numerals 44 and 45 denote a branch or distribution circuit; 46 denotes a feedback resistor; 47 denotes a voltage controlled switch or a voltage controlled switch element. "N" sets of the bit-rate discrimination circuits 6, the control terminals for switching feedback resistor 24, the OR circuits 25, the feedback resistors 46, the voltage controlled switches or voltage controlled switch elements 47 are used in parallel, each set being identified by an index number in parentheses. Because N bit-rate discrimination circuits 6(1)-6(N) are used in parallel, and N sets of a feedback resistor 46 for changing the feedback resistor of the preamplifier 8 and a voltage controlled switch or switch element 47, connected in series, are used in parallel, N+1 bit-rates can be discriminated. For example, it is assumed that the N+1 bit-rates are identified as BR(1), BR(2), ..., BR(N), and BR(N+1), in order of increasing. It is also assumed that the bit-rate discrimination circuit 6(1) can discriminates BR(1) and BR(2); the bit-rate discrimination circuit 6(2) can discriminates BR(2) and BR(3); ...; the bit-rate discrimination circuit 6(N) can discriminates BR(N) and BR(N+1). If the bit-rate of the input signal is BR(K), the bit-rate discrimination circuits 6(K)-6(N) determines that the bit-rate is low, and the bit-rate discrimination circuits 6(1)-6(K-1) determines that the bit-rate is high. A further assumption is made that the bit-rate discrimination circuit 6 outputs high voltage when low bit-rate is received, and low voltage when high bit-rate is received, and that the switch or switch element 47 is switched off for a high voltage signal, and switched on for a low voltage signal. It is possible to switch the combination of band width and gain in dependence on the N+1 bit-rates. If the alarm circuit 23 outputs high voltage when $P_{in} < P_{min}$, and outputs low voltage when $P_{in} \geqq P_{min}$, the feedback resistors are controlled by the OR operation between each output of the bit-rate discrimination circuit and the output of the alarm circuit. According to the above arrangements, if the optical input signal level is lower than the minimum acceptable value of received power, the preamplifier can be switched to the lowest bit-rate mode. The bit-rate automatic control circuit according to the present embodiment corresponds to the bit-rate automatic control circuit according to the first embodiment shown in FIG. 10, in that both circuits has the same polarity of the output of the bit-rate discrimination circuit 6 and the alarm circuit 23, the same polarity of the input to the control terminal 24 for switching the feedback resistor 24 of the preamplifier, and the same logic circuit (the OR circuit 25). However, the variations of the first embodiment shown in FIGS. 12-18 can be modified in the same manner.

FIG. 21 is a block diagram showing a multi bit-rate receiver according to a variation of the second embodiment. In FIG. 21, the same reference symbol as used in FIGS. 19 and 20 denotes a similar component. A reference numeral 48 denotes an N-input D/A converter. The multi bit-rate receiver according to the present variation includes multiple bit-rate discrimination circuits as the multi bit-rate receiver shown in FIG. 20, and controls the value of the feedback resistor 42 as an analog device. Accordingly, if the multi bit-rate receiver is designed so that the multiple (N) outputs of the bit-rate automatic control circuit are converted to an analog signal by the N-input D/A converter 48, and desired values of gain and band width of the preamplifier can be obtained, the multi bit-rate receiver according to the present variation shown in FIG. 21 can achieve the same function of that of the second embodiment shown in FIG. 20.

The preferred embodiments of the present invention have been described above. The present invention is not limited to the specifically disclosed embodiments, and variations and modifications may be made without departing from the scope of the present invention.

The invention claimed is:

1. A bit-rate automatic control circuit for feedback controlling gain and bandwidth of a preamplifier in dependence on a bit-rate of a signal, comprising:
a bit-rate discrimination circuit configured to discriminate the bit rate of the signal;
an alarm circuit configured to determine whether a value of received power of the signal is less than a minimum acceptable value of the preamplifier or not,
wherein
if said alarm circuit determines that the value of received power of the signal is less than the minimum acceptable value of the preamplifier, the bit-rate automatic control circuit determines, irrespective of the discrimination of said bit-rate discrimination circuit, that the bit-rate of the signal is low, and
if said alarm circuit determines that the value of received power of the signal is equal to or more than the minimum acceptable value of the preamplifier, the bit-rate automatic control circuit determines the bit-rate of the signal in accordance with the discrimination made by said bit-rate discrimination circuit.

2. The bit-rate automatic control circuit as claimed in claim 1,
wherein
the bit-rate discrimination circuit can discriminate the bit-rate of the signal higher than the minimum acceptable value of received power in each mode of the preamplifier.

3. The bit-rate automatic control circuit as claimed in claim 1, further comprising an OR circuit having at least two inputs,
wherein
an output of said alarm circuit and an output of said bit-rate discrimination circuit are fed to said OR circuit, and output of said OR circuit is fed to the preamplifier.

4. The bit-rate automatic control circuit as claimed in claim 1, further comprising a negative OR circuit having at least two inputs,
wherein
an output of said alarm circuit and an output of said bit-rate discrimination circuit are fed to said negative OR circuit, and output of said negative OR circuit is fed to the preamplifier.

5. The bit-rate automatic control circuit as claimed in claim 1, further comprising an negative AND circuit having at least two inputs,
wherein
an output of said alarm circuit and an output of said bit-rate discrimination circuit are fed to said negative AND circuit, and output of said negative AND circuit is fed to the preamplifier.

6. The bit-rate automatic control circuit as claimed in claim 1, further comprising an AND circuit having at least two inputs,
wherein
an output of said alarm circuit and an output of said bit-rate discrimination circuit are fed to said AND circuit, and output of said AND circuit is fed to the preamplifier.

7. The bit-rate automatic control circuit as claimed in claim 1, further comprising a switch configured to switch a control signal in dependence on an output from said alarm circuit,
wherein
if said alarm circuit determines that the reception level of the signal is lower than the minimum acceptable value of received power, said switch provides the preamplifier with the same voltage as that of a constant voltage source circuit or ground to the preamplifier, and otherwise said switch provides output of said bit-rate discrimination circuit to the preamplifier.

8. The bit-rate automatic control circuit as claimed in claim 7, wherein a negative circuit or inverted amplifier is provided at an output side.

9. The bit-rate automatic control circuit as claimed in claim 1, further comprising a switch configured to switch a control signal in dependence on an output from said alarm circuit,
wherein
if said alarm circuit determines that the reception level of the signal is lower than the minimum acceptable value of received power, said switch provides the preamplifier with the output of said alarm circuit, and otherwise said switch provides output of said bit-rate discrimination circuit to the preamplifier.

10. The bit-rate automatic control circuit as claimed in claim 9, wherein a negative circuit or inverted amplifier is provided at an output side.

11. The bit-rate automatic control circuit as claimed in claim 1, further comprising a stabilization circuit configured to stabilize output of said alarm circuit, the stabilization circuit branching from an output of said alarm circuit.

12. The bit-rate automatic control circuit as claimed in claim 1, wherein
said bit-rate discrimination circuit is replaced by a plurality of bit-rate discrimination circuits, each having a different threshold value; and
if said alarm circuit determines that the reception level of the signal is below the minimum acceptable value of received power, the bit-rate automatic control circuit determines that the signal has the lowest bit-rate, and if said alarm circuit determines that the reception level of the signal is equal to or higher than the minimum acceptable value of received power, the bit-rate automatic control circuit determines that the signal has the bit-rate discriminated by said plurality of bit-rate discrimination circuits.

13. The bit-rate automatic control circuit as claimed in claim 1, further comprising a D/A converter configured to convert a signal to be fed to the preamplifier into an analog signal.

14. A multi bit-rate receiver capable of adjusting sensitivity to the bit-rate of a signal, the multi bit-rate receiver comprising:
- a preamplifier configured to amplify the signal;
- a main amplifier configured to amplify output of said preamplifier to a constant-amplitude signal;
- the bit-rate automatic control circuit as claimed in claim 1, for feedback controlling the gain and band width of said preamplifier in dependence on the output of said preamplifier and output of said main amplifier.

15. In a multi bit-rate receiver capable of adjusting sensitivity to the bit-rate of a signal, a method of feedback controlling gain and band width of a preamplifier for amplifying the signal, the method comprising the steps of:
- receiving the signal;
- amplifying the received signal;
- discriminating the bit-rate of the amplified signal;
- determining whether a reception level of the amplified signal is below a minimum acceptable value of received power;
- if a determination is made that the reception level of the amplified signal is lower than the minimum acceptable value of received power, determining that the signal has low bit-rate regardless of the discrimination made in the step of discriminating the bit-rate of the amplified signal;
- if a determination is made that the reception level of the amplified signal is equal to or more than the minimum acceptable value of received power, determining that the signal has the bit rate discriminated in the step of discriminating the bit rate of the amplified signal; and
- feedback controlling the gain and band width of the preamplifier based on the determined bit-rate.

* * * * *